(12) United States Patent
Harris et al.

(10) Patent No.: US 7,863,656 B2
(45) Date of Patent: Jan. 4, 2011

(54) SEMICONDUCTOR DEVICE

(75) Inventors: Christopher Harris, Täby (SE); Mietek Bakowski, Stillingsön (SE)

(73) Assignee: Cree Sweden AB, Täby (SE)

( * ) Notice: Subject to any disclaimer, the term of this patent is extended or adjusted under 35 U.S.C. 154(b) by 159 days.

(21) Appl. No.: 12/227,188

(22) PCT Filed: May 12, 2006

(86) PCT No.: PCT/SE2006/000558

§ 371 (c)(1),
(2), (4) Date: Nov. 10, 2008

(87) PCT Pub. No.: WO2007/133123

PCT Pub. Date: Nov. 22, 2007

(65) Prior Publication Data

US 2009/0206347 A1    Aug. 20, 2009

(51) Int. Cl.
*H01L 29/66* (2006.01)

(52) U.S. Cl. .................... 257/263; 257/471

(58) Field of Classification Search ............... 257/263, 257/471, 77, 615, 43, 609, 610, 612
See application file for complete search history.

(56) References Cited

U.S. PATENT DOCUMENTS

| | | | | |
|---|---|---|---|---|
| 5,382,809 | A * | 1/1995 | Nishibayashi et al. | 257/77 |
| 6,313,482 | B1 * | 11/2001 | Baliga | 257/77 |
| 6,870,189 | B1 * | 3/2005 | Harada et al. | 257/77 |

FOREIGN PATENT DOCUMENTS

| | | |
|---|---|---|
| JP | 06-209014 | 7/1994 |
| JP | 06-209015 | 7/1994 |
| WO | 02/099869 | 12/2002 |

* cited by examiner

*Primary Examiner*—Mark Prenty
(74) *Attorney, Agent, or Firm*—Dilworth & Barrese, LLP

(57) ABSTRACT

A unipolar semiconductor device having a drift layer (3) doped according to a first conductivity type forming a conducting path and regions (7, 8) doped according to a second conductivity type and arranged next to the drift layer, has the drift layer and the regions of a semiconductor material having an ionization energy Ei of dopants of the second conductivity type therein exceeding 0.5 eV and/or a solubility of the dopants of the second conductivity type therein being less than $10^{18}$ cm$^{-3}$.

20 Claims, 1 Drawing Sheet

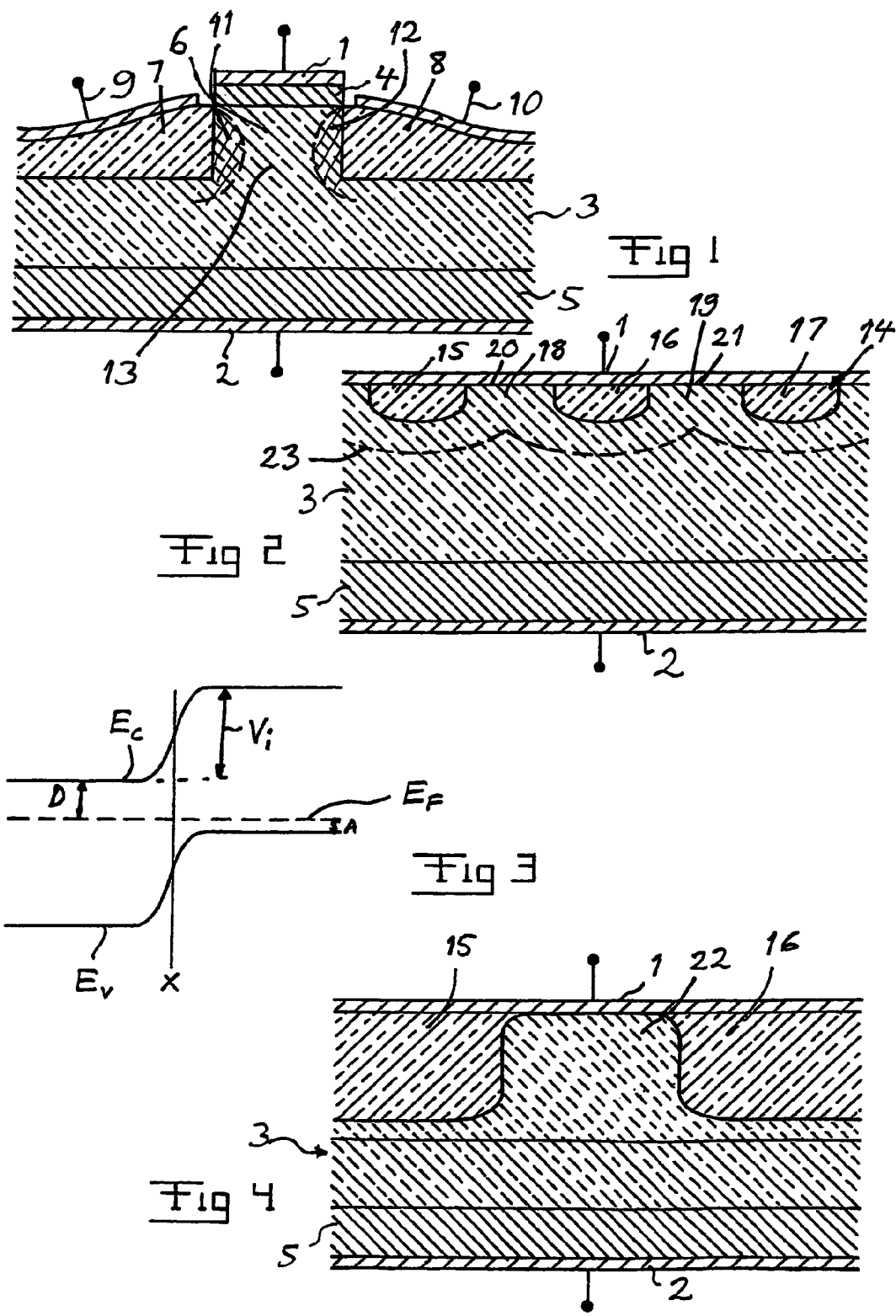

SEMICONDUCTOR DEVICE

TECHNICAL FIELD OF THE INVENTION AND PRIOR ART

The present invention is concerned with a semiconductor device having a source contact and a drain contact interconnected by a drift layer doped by dopants according to a first conductivity type, n or p, for majority charge carrier transport in a conducting path between the source contact and the drain contact in a forward biased state of the device, said device also comprising regions doped by dopants according to a second conductivity type being opposite to said first type, said regions being arranged next to the drift layer so as to deplete parts thereof and being able to form a blocking pn-junction in said conducting path between the source contact and the drain contact for preventing a current to flow between the source contact and the drain contact in a blocking state of the device.

Accordingly, the present invention is occupied with unipolar devices, i.e. in which a conduction is carried out solely by majority charge carriers, such as electrons in a donor doped layer and holes in an acceptor doped layer.

The blocking state of such a device may occur when the device is reverse biased, such as in a JBS (Junction Barrier Schottky) in which said regions deplete portions of the drift layer next to the Schottky contacts, as well as when forward biased, such as in a JFET (Junction Field Effect Transistor) in which a voltage is applied to said regions for depleting said conducting path.

Such unipolar devices of different types are used instead of bipolar devices where particular properties thereof are interesting. One such property is that for instance JFETs are mostly simpler to fabricate and require less space in integrated circuits than bipolar transistors. Other advantages are well known within the art, such that a JBS-device benefits from the lower on-state voltage in the forward conducting state of a Schottky junction than a pn-junction, but the higher blocking capacity in the reverse biased state obtained by a pn-junction shielding the Schottky contacts.

SUMMARY OF THE INVENTION

The object of the present invention is to show a way to in some respect improve a semiconductor device of the type defined in the introduction.

This object is according to the invention obtained by for said drift layer and said regions using a semiconductor material having an ionisation energy Ei of said dopants of said second conductivity type therein exceeding 0.5 eV and/or a solubility of said dopants of said second conductivity type therein being less than $10^{17}$ cm$^{-3}$.

Such semiconductor materials, which may not be provided with a sufficiently high concentration of dopants of said second conductivity type being active at the normal operation temperature of the device, have so far been considered to be useless as doped according to this second conductivity type in semiconductor devices. Thus, this low concentration of active dopants is either due to the fact that suitable dopants have a too large ionisation energy, such as to deep energy levels of donors, so that a low proportion of the dopants will be in the active state at normal operation temperatures, or the solubility of suitable dopants in said semiconductor materials is to low, so that it will not help if the ionisation energy is low and the major part of them are active at normal operation temperatures, or a combination of these two characteristics. However, the present inventors have realised that such semiconductor materials doped according to said second conductivity type may after all be used in devices of this type, since they are only used for depleting parts of a layer or layers doped according to said first conductivity type and not for conducting any current. This means that special properties of such semiconductor materials may be used in devices of this type in spite of the properties thereof with respect to dopants of said second conductivity type.

According to a preferred embodiment of the invention said semiconductor material is a material having an energy gap between the valence band and the conduction band exceeding 2 eV. By using such a semiconductor material the built-in voltage between said regions and the drift layer may still have a considerable magnitude even if the ionisation energy of said dopants of said second conductivity type is rather high, so that it will still be possible to conveniently obtain the depletion aimed at in portions of the drift layer next to said regions.

According to another embodiment of the invention said semiconductor material is diamond.

Diamond has some properties making it extremely interesting as a material in a device for high power applications, one of which is the very high breakdown field strength, which means that the number of devices to be connected in series for holding a voltage of a certain magnitude may be reduced considerably with respect to devices of other known materials involving important cost reduction even if such a device itself would be much more expensive than the prior art devices, which for the rest is not an evident fact. Other interesting properties of diamond is a very high thermal conductivity and high charge mobility. However, there exist today no suitable shallow donors for diamond, but the deep donors, i.e. donors located at a deep energy level with respect to the conduction band of diamond, available will result in a concentration of active dopants at normal operation temperature of a diamond device making such a diamond layer of n-type impossible to use for charge carrier transport. Thanks to the wide band gap between the conduction band and the valence band in diamond of 5.4 eV a high built-in voltage will be obtained even if the donors assume deep levels, such as in the order of 1.5 eV, making it easy to deplete portions of the drift layer through said regions doped with the deep donors. This means that diamond with its many excellent properties may be used in semiconductor devices by using only the good hole conducting properties thereof in the forward biased state of the device and still have a pn-junction preventing a current to flow between the source contact and the drain contact in a blocking state of the device.

According to another embodiment of the invention said dopants of said first conductivity type is B. Boron is similar to carbon and fits therefore well into the carbon lattice of diamond and is well suited as an acceptor dopant of diamond.

According to another embodiment of the invention said dopants of said second conductivity type is N. Nitrogen will assume a deep energy level in diamond lowering the built-in voltage considerably with respect to donors located on a shallow energy level, but this does not have any drastic influence upon the ability of the n-type regions to efficiently deplete sufficiently large portions of the drift layer when desired thanks to the still important magnitude of the built-in voltage in the order of 4 eV.

According to another embodiment of the invention said semiconductor material is AlN, BN or ZnO. These are semiconductor materials having interesting properties but for which there exist problems with respect to the provision thereof with donors or acceptors as a result of an ionisation energy exceeding 0.5 eV and/or a solubility being less than $10^{18}$ cm$^{-3}$. By using these materials provided with such dopants as said regions not used for conduction, it is possible to benefit from the favourable properties of these materials in semiconductor devices.

According to another embodiment of the invention said semiconductor material is AlN and said first conductivity type is n. A substantially higher conductivity of n-doped than p-doped AlN is today achievable making a semiconductor device of this type suitable.

According to another embodiment of the invention the device is a Junction Barrier Shottky-device (JBS) and said regions are adapted to form a grid and are laterally separated by portions of said drift layer, and said grid is adapted to form said blocking pn-junction in said blocking state of the device by completely depleting said portions of the drift layer, so that a continuous layer doped according to said second conductivity type is formed by said grid and said portions.

In the case of such a JBS having diamond as semiconductor material said source contact forming a contact to said portions of the drift layer and a Schottky-barrier thereto is made of Al, Pt or Ti, which have suitably low on-state voltages in the forward conducting state of the device.

According to another embodiment of the invention the device is a Junction Field Effect Transistor (JFET) with said regions forming a gate and connectable to a voltage source for controlling the depletion of said conducting path of the drift layer.

According to another embodiment of the invention said drift layer also comprises a first sub-layer having a higher doping concentration than the rest of the drift layer located next to the drain contact, and said regions are located close to said source contact. According to a further embodiment of the invention said drift layer has a second sub-layer with a lower doping concentration than the rest of the drift layer and located next to said regions for facilitating depletion of the drift layer next to these regions, and said second sub-layer of the drift layer may be located close to said source contact.

The first sub-layer may be used for obtaining a better contact to the drain contact, whereas it will be suitable to have a lower dopant concentration in said second sub-layer next to said regions for facilitating depletion of the drift layer there.

Thus, "drift layer" as defined here is intended to cover the entire conducting path in said semiconductor material doped according to the first conductivity type, such as different sub-layers having different doping concentrations and normally called buffer layer, substrate layer and the like.

Further advantages as well as advantageous features of the invention will appear from the following description.

BRIEF DESCRIPTION OF THE DRAWING

With reference to the appended drawing, below follows a specific description of embodiments of the invention cited as examples.

In the drawing:

FIG. 1 is a very schematic cross-section view. of a semiconductor device in the form of JFET according to a first embodiment of the invention, FIG. 2 is a view similar to that of FIG. 1 of a JBS-diode according to a second embodiment of the invention, FIG. 3 is a band diagram across the border between said drift layer and a said region in a semiconductor device according to the present invention, and FIG. 4 is a view similar to that of FIG. 1 of a JBS-diode according to a third embodiment of the present invention.

DETAILED DESCRIPTION OF EMBODIMENTS OF THE INVENTION

It is pointed out that the drawings do not show the different parts of the semiconductor devices in scale, but they are only used for illustrating the principles and ideas of the present invention, so that the relative dimensions of the different layers may in fact be totally different than shown.

FIG. 1 illustrates a Junction Field Effect Transistor (JFET) according to the present invention. This has a metallic source contact 1 and a metallic drain contact 2 separated by a drift layer 3 of diamond doped by acceptors, preferably in the form of Boron (B). The two sub-layers 4, 5 next to the source contact and the drain contact, respectively, are doped according to a higher doping concentration for making better contacts to these contacts. An upper portion 6 of the drift layer is laterally surrounded by n-doped regions 7, 8 provided with donors in the form of Nitrogen (N) on deep energy levels. These regions are connectable to a voltage source at 9, 10 for applying a gate voltage thereto for controlling the extension of depletion layers 11, 12 indicated by dashed lines in the drift layer.

The concentration $N_D$ of active donors in the regions 7, 8 may be calculated according to the relation (1) below:

$$N_D \sim N_0 e^{-\frac{Ei}{kT}} \quad (1)$$

where $N_0$ is the solubility of the donors in the semiconductor material (diamond), Ei is the ionisation energy of the donors, i.e. the difference between the energy level of the donors and the conduction band in the semiconductor material, k is the Bolzman constant and T is the temperature in K.

Since Ei is rather high the concentration of active donors $N_D$ will be low at normal operation temperature of the device.

However, the built-in voltage between the regions 7, 8 and the drift layer 3 will still be sufficiently high, which will be further explained below with reference to FIG. 3, so that it will be comparatively easy to deplete the drift layer portion 6 when desired.

The function of such a JFET is well known within the art, and an electric current will in the forward biased state of the device, i.e. when applying a forward bias between the source contact 1 and the drain contact 2, flow between these contacts by a transport of majority charge carriers in the form of positive holes along a conducting path 13 in said drift layer. The device is brought into a blocking state by providing a gate voltage on the regions 7, 8 being sufficient for depleting the entire portion 6 of the drift layer therebetween, so that a reverse biased pn-junction is formed.

FIG. 2 illustrates a device according to the present invention in the form of a Junction Barrier Schottky-diode (JBS) having a source contact 1 and a drain contact 2 separated by a drift layer 3 having a higher doped sub-layer 5 next to the drain contact. The drift layer is p-doped, and a n-type grid 14 is formed by n-type regions 15-17 in contact with the source contact 1 and laterally separated by portions 18, 19 of the drift layer. The metal used for forming the source contact I is selected to form contacts 20, 21 to said portions of the drift layer with a low Schottky-barrier, such as below 2 eV. Suitable materials for the drain contact are for this sake Al, Pt and Ti. The function of such a JBS is well known within the art, and the low on-state voltage of the Schottky-contact 20, 21 is utilised in the forward biased state for conducting a current between the source contact and the drain contact through transport of positive holes, whereas the regions 15-17 will in the reverse biased state of the device completely deplete the drift layer portions 18, 19 and form a continuously n-type layer shielding the source contact, so that a blocking pn-junction, which may take considerably higher electric fields than a reverse biased Schottky-junction may be formed.

FIG. 3 schematically illustrates the development of the conduction band $E_C$ and the valence band $E_V$ at the border x in diamond between a region doped with donors in the form of nitrogen to the left of x and a drift layer doped with acceptors, such as B, to the right of x. The Fermi energy $E_F$ is indicated by the dashed line, in which the ionisation energy of the donors is indicated by D and of the acceptors by A. The built-in voltage $V_i$ will still be substantial in spite of the comparatively high ionisation energy of the donors in the order of 1.5 eV, since the total gap between the conduction band and the valence band is in diamond approximately 5.4 eV. The higher the built-in voltage the easier to form a thick depletion layer next to the border.

FIG. 4 illustrates a JBS differing slightly from that shown in FIG. 2 by having a low doped sub-layer 22 next to the regions 15, 16 doped according to the second conductivity type for making it still easier to fully deplete this portion of the drift layer in the reverse biased state of the JBS.

The invention is of course not in any way restricted to the embodiments thereof described above, but many possibilities to modifications thereof would be apparent to a person with ordinary skill in the art without departing from the basic idea of the invention as defined in the appended claims.

The invention is just as well applicable to semiconductor materials which may be provided with dopants of said second conductivity type at shallow levels, which typically means that more than 10% thereof are active at normal operation temperatures of the device, but in which the solubility $N_0$ is rather low making such semiconductor layers useless for current conducting purposes.

Neither is the invention restricted to the dopants mentioned in this disclosure, but the basic idea of the invention covers all dopants having an ionisation energy and/or solubility being as defined.

The invention claimed is:

1. A semiconductor device having a source contact (1) and a drain contact (2) interconnected by a drift layer (3) doped by dopants according to a first conductivity type, n or p, for majority charge carrier transport in a conducting path (13) between the source contact and the drain contact in a forward biased state of the device, said device also comprising regions (7, 8, 15-17) doped by dopants according to a second conductivity type being opposite to said first type, said regions being arranged next to the drift layer so as to deplete parts thereof and being able to form a blocking pn-junction in said conducting path between the source contact and the drain contact for preventing a current to flow between the source contact and the drain contact in a blocking state of the device, wherein said drift layer and said regions are of a semiconductor material having an ionisation energy Ei of said dopants of said second conductivity type in this semiconductor material exceeding 0.5 eV and/or a solubility of said dopants of said second conductivity type in this semiconductor material being less than $10^{18}$ cm$^{-3}$.

2. A device according to claim 1, wherein said semiconductor material is a material having an energy gap between the valence band and the conduction band exceeding 2 eV.

3. A device according to claim 1, wherein said semiconductor material is diamond.

4. A device according to claim 3, wherein said first conductivity type is p and said second conductivity type is n.

5. A device according to claim 4, wherein said dopants of said first conductivity type is B.

6. A device according to claim 4, wherein said dopants of said second conductivity type is N.

7. A device according to claim 1, wherein said semiconductor material is AlN, BN or ZnO.

8. A device according to claim 7, wherein said dopants of said second conductivity type have an ionisation energy Ei in said semiconductor material exceeding 0.5 eV.

9. A device according to claim 7, wherein said semiconductor material is AlN and said first conductivity type is n.

10. A device according to claim 1, wherein it is a Junction Barrier Shottky-device (JBS) and said regions (15-17) are adapted to form a grid (14) and are laterally separated by portions (20, 21) of said drift layer, and said grid is adapted to form said blocking pn-junction (23) in said blocking state of the device by completely depleting said portions of the drift layer, so that a continuous layer doped according to said second conductivity type is formed by said grid and said portions.

11. A device according to claim 10, wherein said semiconductor material is diamond and said source contact (1) forming a contact to said portions of the drift layer and a Shottky-barrier thereto is made of Al, Pt or Ti.

12. A device according to claim 1, wherein it is a Junction Field Effect Transistor (JFET) with said regions (7, 8) forming a gate and connectable to a voltage source (9, 10) for controlling the depletion of said conducting path (13) of the drift layer (3).

13. A device according to claim 1, wherein said drift layer (3) also comprises a first sub-layer (5) having a higher doping concentration than the rest of the drift layer and located next to the drain contact (2), and that said regions (7, 8, 15-17) are located close to said source contact (1).

14. A device according to claim 1, wherein said drift layer (3) has a sub-layer (22) with a lower doping concentration than the rest of the drift layer and located next to said regions (15, 16) for facilitating depletion of the drift layer next to these regions.

15. A device according to claim 14, wherein said sub-layer (22) of the drift layer is located close to said source contact (1).

16. A device according to claim 2, wherein said semiconductor material is diamond.

17. A device according to claim 16, wherein said first conductivity type is p and said second conductivity type is n.

18. A device according to claim 17, wherein said dopants of said first conductivity type is B.

19. A device according to claim 18, wherein said dopants of said second conductivity type is N.

20. A device according to claim 5, wherein said dopants of said second conductivity type is N.

* * * * *